(12) United States Patent
Wang

(10) Patent No.: US 11,437,408 B2
(45) Date of Patent: Sep. 6, 2022

(54) DISPLAY DEVICE AND ELECTRONIC APPARATUS

(71) Applicant: WUHAN CHINA STAR OPTOELECTRONICS SEMICONDUCTOR DISPLAY TECHNOLOGY CO., LTD., Hubei (CN)

(72) Inventor: Hai Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 94 days.

(21) Appl. No.: 16/963,513

(22) PCT Filed: Jun. 3, 2020

(86) PCT No.: PCT/CN2020/094088
§ 371 (c)(1),
(2) Date: Jul. 21, 2020

(87) PCT Pub. No.: WO2021/227147
PCT Pub. Date: Nov. 18, 2021

(65) Prior Publication Data
US 2021/0358969 A1 Nov. 18, 2021

(30) Foreign Application Priority Data
May 15, 2020 (CN) .......................... 202010411083.9

(51) Int. Cl.
*H01L 27/32* (2006.01)
*G09G 5/00* (2006.01)
(Continued)

(52) U.S. Cl.
CPC ........ *H01L 27/1222* (2013.01); *G06F 1/1605* (2013.01); *G09G 3/20* (2013.01); *G09G 2320/0673* (2013.01)

(58) Field of Classification Search
CPC ..... H01L 27/32; H01L 27/1222; H01L 27/12; H01L 27/15; H01L 51/00; H01L 51/44;
(Continued)

(56) References Cited

U.S. PATENT DOCUMENTS 9,984,638 B2   5/2018   Yang et al.
2013/0215323 A1*  8/2013  Kim .................... H04N 5/2254
                                                       348/373
(Continued)

FOREIGN PATENT DOCUMENTS

CN    108269840 A    7/2018
CN    108922900 A    11/2018
(Continued)

*Primary Examiner* — Chanh D Nguyen
*Assistant Examiner* — Nguyen H Truong
(74) *Attorney, Agent, or Firm* — Mark M. Friedman

(57) ABSTRACT

A display device and an electronic apparatus both include a display part and a camera part. The display part has a first display region and a second display region. The first display region is around the second display region. A pixel density of the second display region is less than a pixel density of the first display region, wherein a plurality of first sub-pixels within the first display region are configured into a red-green-blue-green array, and a plurality of second sub-pixels within the second display region are configured into a red-green-blue array. The camera part is disposed at a position corresponding to the second display region on a side of the display part. Thus, it can solve a problem of complex panel opening and assembly in the prior art.

13 Claims, 3 Drawing Sheets

(51) Int. Cl.
*H01L 27/12* (2006.01)
*G06F 1/16* (2006.01)
*G09G 3/20* (2006.01)

(58) Field of Classification Search
CPC ......... H01L 51/50; H01L 51/51; H01L 51/52;
H01L 51/56; G09G 3/20; G09G 3/22;
G09G 3/32; G09G 3/3208; G09G 3/3233;
G09G 3/3225; G09G 3/3275; G09G
3/3258; G09G 5/00; G09G 5/02; G09G
5/14; G09G 2320/0673; G06F 1/16; G06F
1/1605; G06F 3/14; G06F 3/20; G06F
3/041; G06F 3/042; G06F 3/044; H04N
5/33; H04N 5/232; H04N 5/247; H04N
5/225; H04N 7/14; H04N 9/04
See application file for complete search history.

(56) References Cited

U.S. PATENT DOCUMENTS

| | | | |
|---|---|---|---|
| 2016/0321975 | A1 | 11/2016 | Yan et al. |
| 2019/0187756 | A1* | 6/2019 | Sun .................... G06K 9/00087 |
| 2019/0278967 | A1* | 9/2019 | Shepelev ................. G09G 3/32 |
| 2019/0303639 | A1* | 10/2019 | He ....................... G06K 9/0012 |
| 2020/0227488 | A1* | 7/2020 | Xin ..................... H01L 27/3225 |
| 2020/0312925 | A1* | 10/2020 | Xia ..................... H01L 25/0753 |
| 2021/0065625 | A1* | 3/2021 | Wang .................. G09G 3/3266 |
| 2021/0343815 | A1* | 11/2021 | Seo ..................... H01L 27/3262 |
| 2021/0351236 | A1* | 11/2021 | Shin ..................... H01L 27/322 |
| 2022/0019758 | A1* | 1/2022 | Jia ....................... G06V 40/1318 |

FOREIGN PATENT DOCUMENTS

| | | |
|---|---|---|
| CN | 109743430 A | 5/2019 |
| CN | 110071150 A | 7/2019 |
| CN | 110071160 A | 7/2019 |
| CN | 209390119 A | 9/2019 |
| CN | 110610966 A | 12/2019 |
| CN | 110634434 A | 12/2019 |
| CN | 110675754 A | 1/2020 |
| CN | 110675825 A | 1/2020 |
| CN | 111091772 A | 5/2020 |

* cited by examiner

DISPLAY DEVICE AND ELECTRONIC APPARATUS

FIELD OF THE INVENTION

The present disclosure relates to the technical field of display, and specifically to a display device and an apparatus with a camera under panel function.

BACKGROUND OF THE INVENTION

To realize human-machine interaction, terminals such as mobile phones usually adopt fingerprint recognition, facial recognition, iris recognition, and other technologies to achieve security authentication, or adopt a front camera to take a picture and chat with video, etc. In general, these functions are separately installed in existing mobile phones. With the development of full-screen technology, a screen ratio of a mobile phone is always an indicator that terminal brand manufacturers focus on promoting.

For example, in order to improve the screen ratio of the mobile phone, incision (Notch) technology is adopted. Besides, optical sensors are used under the screen to replace fingerprint recognition (FPS). Alternatively, Lifting camera technology is used to hide the front camera. Furthermore, with a concept of the camera under panel (CUP) being proposed, it will appear that the phone has the camera under the panel and the panel can be displayed normally.

However, if the technologies, such as Notch, FPS, and CUP, are adopted to a single panel, in which other sensor such as an infrared (IR) sensor is installed, not only does the entire panel require many openings, but assembly of a flexible printed circuit board (FPC) on the back is also very complicated.

Therefore, it is necessary to provide a solution to solve the problems existing in the prior art.

SUMMARY OF THE INVENTION

The present disclosure provides a display device and an electronic apparatus, to solve a problem of complex panel opening and assembly in the prior art.

In order to achieve the above object of the present disclosure, an aspect of the present disclosure provides a display device, which includes: a display part having a first display region and a second display region, wherein the first display region is around the second display region, a pixel density of the second display region is less than a pixel density of the first display region, a plurality of first sub-pixels within the first display region are configured into a red-green-blue-green array, a plurality of second sub-pixels within the second display region are configured into a red-green-blue array, a thickness of each of the second sub-pixels within the second display region is greater than a thickness of each of the first sub-pixels within the first display region, and a gap between the second sub-pixels of two adjacent rows or two adjacent columns within the second display region is larger than a gap between the first sub-pixels of two adjacent rows or two adjacent columns within the first display region; and a camera part disposed at a position corresponding to the second display region on a side of the display part.

In an embodiment of the present disclosure, a light-emitting area of each of the second sub-pixels within the second display region is greater than a light-emitting area of each of the first sub-pixels within the first display region.

In an embodiment of the present disclosure, the camera part has an image-acquiring-end portion toward the display part, and the image-acquiring-end portion is formed into a flat surface, an inclined surface, or a concave curved surface.

In an embodiment of the present disclosure, the display part includes a substrate, an array layer, a pixel layer, a thin-film encapsulation layer, and a cover, which are sequentially stacked, wherein the substrate is provided with a concave-hole portion that is combined with the image-acquiring-end portion.

In an embodiment of the present disclosure, the substrate includes a first polyimide layer, a silicon oxide layer, and a second polyimide layer, wherein the silicon oxide layer is located between the first polyimide layer and the second polyimide layer, the second polyimide layer is combined with the array layer, a part of the concave-hole portion is formed into a closed-hole portion on the second polyimide layer, and the closed-hole portion is attached to the image-acquiring-end portion.

In an embodiment of the present disclosure, the display part is electrically connected to a controller that generates a first gamma control signal and a second gamma control signal, wherein the first gamma control signal is configured to control the first sub-pixels within the first display region, the second gamma control signal is configured to control the second sub-pixels within the second display region, so that a brightness curve of the second display region is raised to a brightness curve of the first display region.

In an embodiment of the present disclosure, the second display region is shaped as a rectangular region or a hexagonal region.

In order to achieve the above object, another aspect of the present disclosure provides a display device, which includes: a display part having a first display region and a second display region, wherein the first display region is around the second display region, a pixel density of the second display region is less than a pixel density of the first display region, a plurality of first sub-pixels within the first display region are configured into a red-green-blue-green array, and a plurality of second sub-pixels within the second display region are configured into a red-green-blue array; and a camera part disposed at a position corresponding to the second display region on a side of the display part.

In an embodiment of the present disclosure, a light-emitting area of each of the second sub-pixels within the second display region is greater than a light-emitting area of each of the first sub-pixels within the first display region.

In an embodiment of the present disclosure, a thickness of each of the second sub-pixels within the second display region is greater than a thickness of each of the first sub-pixels within the first display region.

In an embodiment of the present disclosure, a gap between the second sub-pixels of two adjacent rows or two adjacent columns within the second display region is larger than a gap between the first sub-pixels of two adjacent rows or two adjacent columns within the first display region.

In an embodiment of the present disclosure, the camera part has an image-acquiring-end portion toward the display part, and the image-acquiring-end portion is formed into a flat surface, an inclined surface, or a concave curved surface.

In an embodiment of the present disclosure, the display part comprises a substrate, an array layer, a pixel layer, a thin-film encapsulation layer, and a cover, which are sequentially stacked, wherein the substrate is provided with a concave-hole portion that is combined with the image-acquiring-end portion.

In an embodiment of the present disclosure, the substrate comprises a first polyimide layer, a silicon oxide layer, and a second polyimide layer, wherein the silicon oxide layer is located between the first polyimide layer and the second polyimide layer, the second polyimide layer is combined with the array layer, a part of the concave-hole portion is formed into a closed-hole portion on the second polyimide layer, and the closed-hole portion is attached to the image-acquiring-end portion.

In an embodiment of the present disclosure, the display part is electrically connected to a controller that generates a first gamma control signal and a second gamma control signal, wherein the first gamma control signal is configured to control the first sub-pixels within the first display region, the second gamma control signal is configured to control the second sub-pixels within the second display region, so that a brightness curve of the second display region is raised to a brightness curve of the first display region.

In an embodiment of the present disclosure, the second display region is shaped as a rectangular region or a hexagonal region.

Compared with the prior art, the display device and the electronic apparatus of the present disclosure are provided, in which the pixel density of the second display region is less than the pixel density of the first display region, the first sub-pixels within the first display region are configured into the red-green-blue-green array, and the second sub-pixels within the second display region are configured into the red-green-blue array. In addition, the camera part is combined at the position corresponding to the second display region, such that the camera part can be used as an integrated solution for optical photographing, instead of separating multiple sensors with openings in the prior art. It can simplify the panel opening process and reduce the complexity of assembly of the whole device, and can also improve overall aesthetics.

DETAILED DESCRIPTION OF THE PREFERRED EMBODIMENTS

The following description of the various embodiments is provided with reference to accompanying drawings. Furthermore, directional terms mentioned in the present disclosure, such as up, down, top, bottom, front, rear, left, right, inner, outer, side, around, central, horizontal, lateral, vertical, longitudinal, axial, radial, the upper layer, or the lower layer, which only refer to the direction of drawings. Therefore, the directional terms are used for a purpose of illustrating and understanding of the present disclosure and are not intended to limit the present disclosure.

A display device of embodiments of the present disclosure can be various display devices with cameras under panel function. For example, it can be configured as a part of a smartphone, but not limited thereto. The display device can also be configured as a part of an electronic apparatus with other functions, such as a tablet computer or desktop screen. Here, only the smartphone is used as an example for description.

Figure 1:
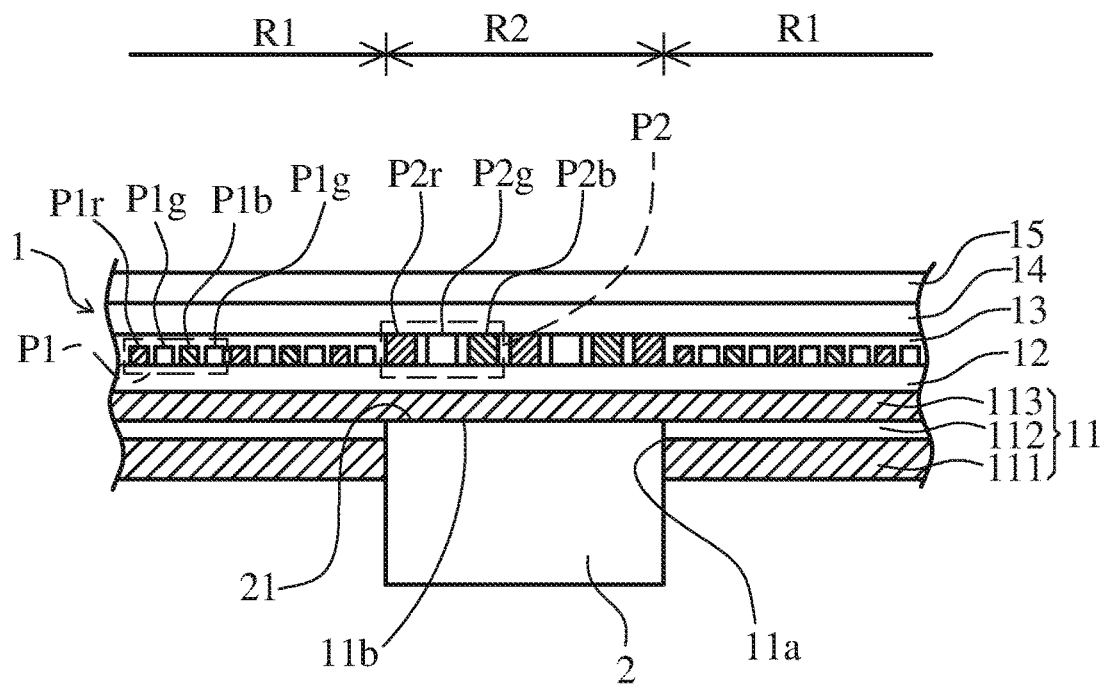
FIG. 1 is a schematic cross-sectional view of an image-acquiring-end portion in a display device being a flat surface, according to embodiments of the present disclosure.

Please refer to FIG. 1, the display device includes a display part 1 and a camera part 2. The display part 1 has a first display region R1 and a second display region R2. The first display region R1 is around the second display region R2. The first display region R1 is provided with a plurality of pixel P1. The second display region R2 is provided with a plurality of pixels P2. A pixel density (such as pixel per inch, PPI) of the second display region R2 is less than a pixel density of the first display region R1. A plurality of first sub-pixels within the first display region R1 are configured into a red-green-blue-green array (such as an RGBG array), a plurality of second sub-pixels within the second display region R2 are configured into a red-green-blue array (such as a Real RGB array). For example, the second display region R2 can be shaped as a rectangular region, but not limited thereto. The second display region R2 can also be shaped as a hexagonal region or other shapes. The camera part 2 is disposed at a position corresponding to the second display region R2 on a side of the display part 1. The following examples illustrate implementations of the display device of the embodiments of the present disclosure, but not limited thereto.

Providing an example for illustration, as shown in FIG. 1, the display part 1 can be a display panel capable of setting camera parts under a screen, such as a liquid crystal display (LCD) panel or an organic light-emitting diode (OLED) panel. The display part 1 can be configured to provide the first display region R1 and the second display region R2, such that the first display region R1 can be configured to display images, and the second display region R2 can be configured to display images and for photographing. For example, when an image is acquired, the second display region R2 does not display the image and has a certain degree of light transmission performance so that the camera part 2 can photograph via the second display region R2. The camera part 2 may include optical sensors, such as a camera having a charge-coupled device (CCD), but not limited thereto.

Optionally, in an embodiment, as shown in FIG. 1, the camera part 2 may include an image-acquiring-end portion 21. For example, the image-acquiring-end portion 21 may be formed into a flat surface and toward the display part 1, thereby adopting the display part 1 to acquire images.

Figure 2:
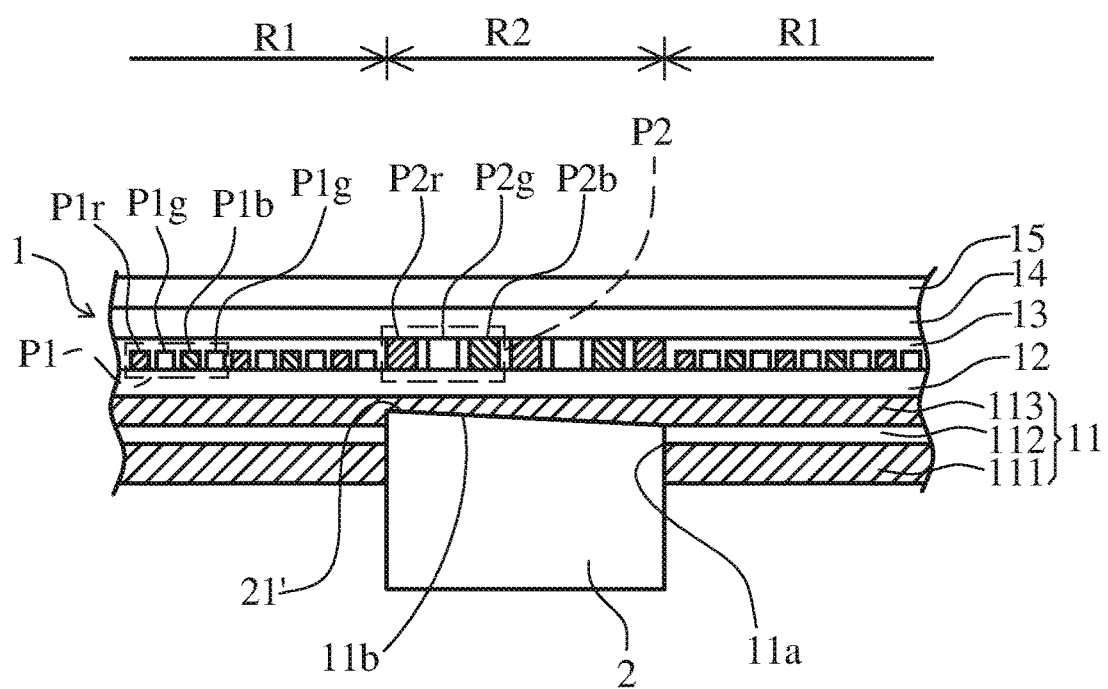
FIG. 2 is a schematic cross-sectional view of the image-acquiring-end portion in the display device being an inclined surface, according to embodiments of the present disclosure.

Alternatively, in an embodiment, as shown in FIG. 2, the camera part 2 may include an image-acquiring-end portion 21'. For example, the image-acquiring-end portion 21' may be formed into an inclined surface and toward the display part 1. Therefore, by designing an appropriate angle to the image-acquiring-end portion 21', if the camera part 2 is not directly above a subject to be photographed, the visual distortion caused by photographing can be optimized.

Figure 3:
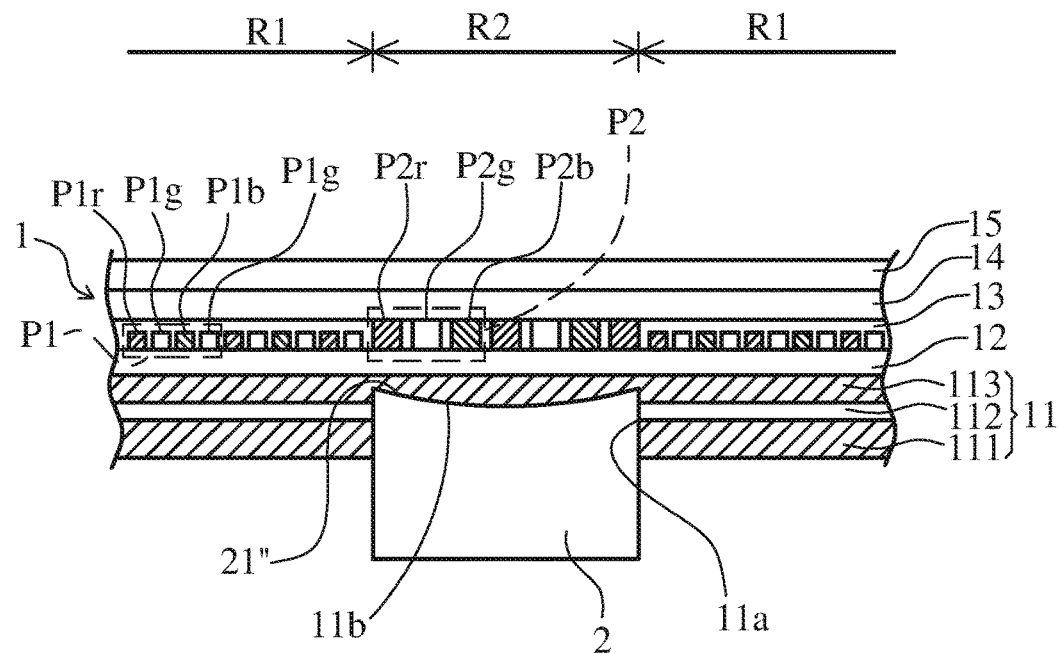
FIG. 3 is a schematic cross-sectional view of the image-acquiring-end portion in the display device being a concave surface, according to embodiments of the present disclosure.

Alternatively, as shown in FIG. 3, the camera part 2 may include an image-acquiring-end portion 21". For example, the image-acquiring-end portion 21' may be formed into a concave curved surface and toward the display part 1.

Therefore, the effective contact area with the display part is increased by the image-acquiring-end portion, thereby increasing the number of pixels of the optical sensor in the camera part, increasing resolution, and improving the signal-to-noise ratio (SNR) as used for security authentication. Thus, camera parts with high PPI required for safety certification can be implemented.

Providing an example for illustration, as shown in FIGS. 1 to 3, taking the OLED panel as an example, the display part 1 may include a substrate 11, an array layer 12, a pixel layer 13, a thin-film encapsulation (TFE) layer 14, and a cover 15, which are sequentially stacked. The substrate 11 is provided with a concave-hole portion 11a, e.g., at a position corresponding to the second display region R2, to be combined with the image-acquiring-end portion 21, 21', or 21".

Specifically, as shown in FIGS. 1 to 3, the substrate 11 may include a first polyimide (PI-1) layer 111, a silicon oxide (SiO) layer 112, and a second polyimide (PI-2) layer 113. The silicon oxide layer 112 is located between the first polyimide layer 111 and the second polyimide layer 113. The second polyimide layer 113 is combined with the array layer 12. For example, a part of the concave-hole portion 11a is formed into a closed-hole portion 11b on the second polyimide layer 113. The closed-hole portion 1 lb is attached to the image-acquiring-end portion 21, 21', or 21". The closed-hole portion 1 lb can be formed into a shape corresponding to the image-acquiring-end portion 21, 21', or 21". For example, the closed-hole portion 1 lb can be formed into a flat surface, an inclined surface, or a convex curved surface, to attach the flat surface, the inclined surface, or the concave curved surface formed at the image-acquiring-end portion 21, 21', or 21", respectively, but not limited thereto. The array layer 12 may include a plurality of thin-film transistors (TFTs), which are configured to control sub-pixels in the sub-pixel layer 13. The thin-film encapsulation layer 14 can be used as a gas barrier for protecting the pixel layer 13, such as blocking moisture and oxygen. The cover 15 may have polarization, touch, and protection functions, such as including a polarization (POL) layer, a touch (TP) layer, and a glass (CG) layer, wherein the polarization layer is combined with the thin-film encapsulation layer 14, and the touch layer is located between the polarization layer and the glass layer.

Therefore, by providing a PI semi-penetrating hole at a position corresponding to the second display region of the display device for combining with the camera part, the camera part can be used as an integrated solution for optical photographing, such as an under panel cross-certification (UPCC) solution. It can realize technologies, such as a transparent display of camera under panel (CUP) and fingerprint recognition (FPS)/infrared (IR) security authentication, instead of separating multiple sensors with openings in the prior art. Thus, it can effectively achieve that various technologies of flexible printed circuit boards are integrated to communicate with controllers in a centralized manner, which can simplify the panel opening process and reduce the complexity of FPC assembly in the whole device, thereby optimizing the design of the panel and simplifying the device (such as a mobile phone) assembly process.

Figure 4:
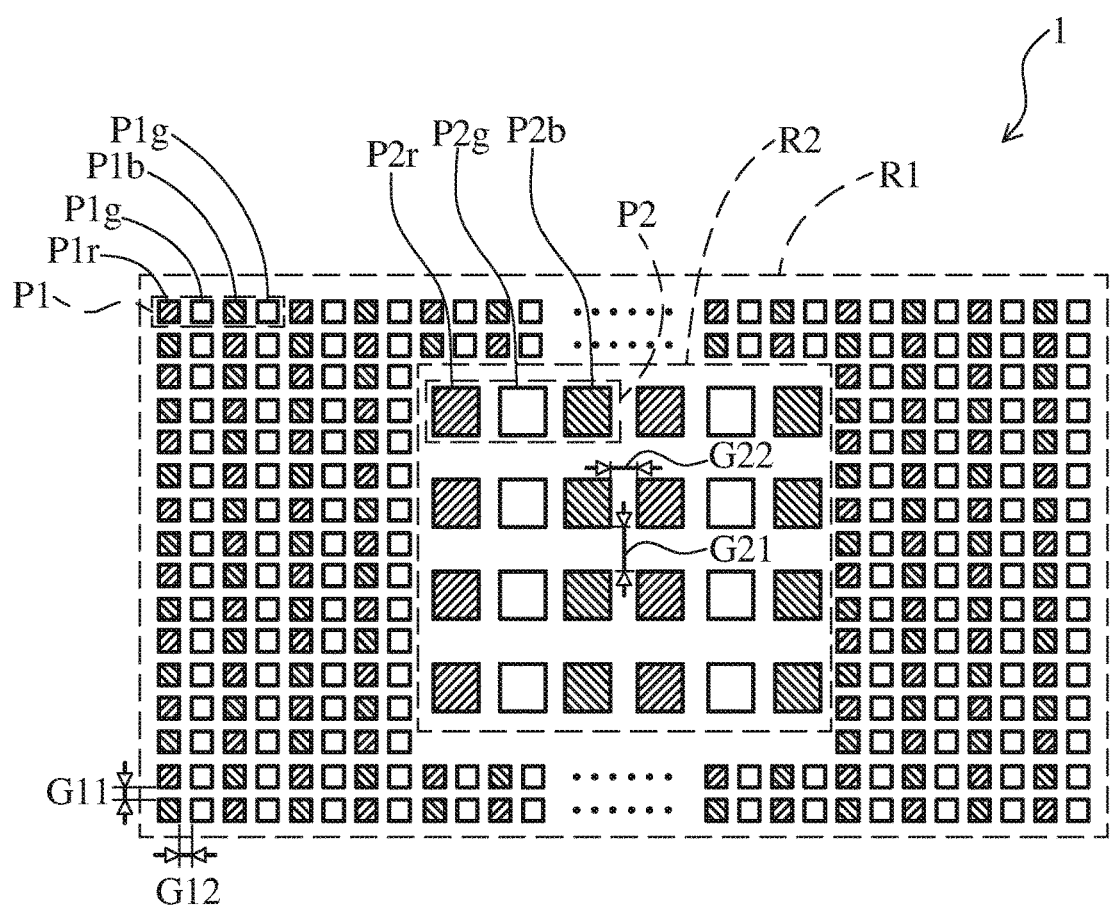
FIG. 4 is a schematic diagram of an array configuration of sub-pixels within a first display region and a second display region, according to embodiments of the present disclosure.

Providing an example for illustration, as shown in FIG. 4, the first display region R1 may include a plurality of first pixels P1, wherein the first pixels P1 are configured into the red-green-blue-green array. For example, each of the first pixels P1 may include a plurality of first sub-pixels, such as a red sub-pixel P1r, two green sub-pixels P1g, and a blue sub-pixel P1b. In the red-green-blue-green array, the sub-pixels in each of rows are repeatedly arranged into P1r, P1g, P1b, P1g, . . . , and so on. Then, the sub-pixels are repeatedly arranged in a column by column manner to form a configuration of the RGBG array.

In another aspect, as shown in FIG. 4, the second display region R2 may include a plurality of second pixels P2, wherein the second pixels P2 are configured into the red-green-blue array. For example, each of the second pixels P2 may include a plurality of second sub-pixels, such as a red sub-pixel P2r, a green sub-pixel P2g, and a blue sub-pixel P2b. In the red-green-blue array, the sub-pixels in each of rows are repeatedly arranged into P2r, P2g, P2b, . . . , and so on. Then, the sub-pixels are repeatedly arranged in a column by column manner to form a configuration of the Real RGB array.

Specifically, many characteristics of each of the second sub-pixels within the second display region R2 and each of the first sub-pixels within the first display region R1 may be different, to realize that pixel density of the second display region R2 is less than pixel density of the first display region R1. Therefore, by providing that the pixel density of the second display region is less than the pixel density of the first display region, to increase the light flux of the camera part as photographing (e.g., for authentication, etc.), thereby improving photographing effect.

Optionally, in an embodiment, as shown in FIG. 3, a thickness of each of the second sub-pixels (such as P2r, P2g, and P2b) within the second display region R2 is greater than a thickness of each of the first sub-pixels (such as P1r, P1g, and P1b) within the first display region R1. Therefore, by increasing the thickness of each of the sub-pixels, the service life of the display device can be increased.

Optionally, in an embodiment, as shown in FIG. 4, a light-emitting area of each of the second sub-pixels (such as P2r, P2g, and P2b) within the second display region R2 is greater than a light-emitting area of each of the first sub-pixels (such as P1r, P1g, and P1b) within the first display region R1. Therefore, by enlarging the light-emitting area of each of the sub-pixels, the service life of the display device can further be increased.

Optionally, in an embodiment, as shown in FIG. 4, a gap between the second sub-pixels (such as P2r, P2g, and P2b) of two adjacent rows or two adjacent columns within the second display region R2 is larger than a gap between the first sub-pixels (such as P1r, P1g, and P1b) of two adjacent rows or two adjacent columns within the first display region R1. Providing an example for illustration, as shown in FIG. 4, a gap G21 between the second sub-pixels of two adjacent rows or a gap G22 between the second sub-pixels of two adjacent columns within the second display region R2 is larger than a gap G11 between the first sub-pixels of two adjacent rows or a gap G12 between the first sub-pixels of two adjacent columns within the first display region R1. Therefore, by increasing the gap of two adjacent second sub-pixels within the second display region, such that light passing through the gaps increases, the light flux of the camera part as photographing (e.g., for authentication, etc.) is effectively increased, thereby further improving photographing effect.

In addition, as shown in FIG. 4, the pixel density of the second display region R2 is less than the pixel density of the first display region R1. For example, the number of light-emitting units within the second display region R2 is less than that within the first display region R1. To make display effects of the first display region R1 and the second display region R2 tend to be consistent, for example, gamma (Gamma) control signals can be provided separately to the first display region R1 and the second display region R2, such that a brightness curve C2 of the second display region R2 can be raised to a brightness curve C1 of the first display region R1. At the same time, two different sub-pixel rendering (SPR) control signals can also be provided to adapt to the light-emitting units arranged in different ways in the first display region R1 and the second display region R2.

Figure 5:
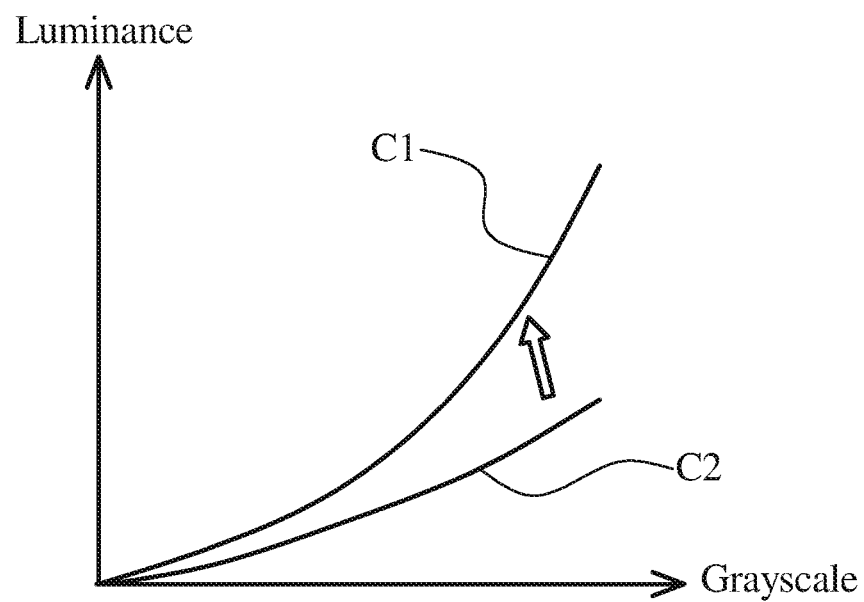
FIG. 5 is a schematic diagram of characteristic curves of the first display region and the second display region, according to embodiments of the present disclosure.
Figure 6:
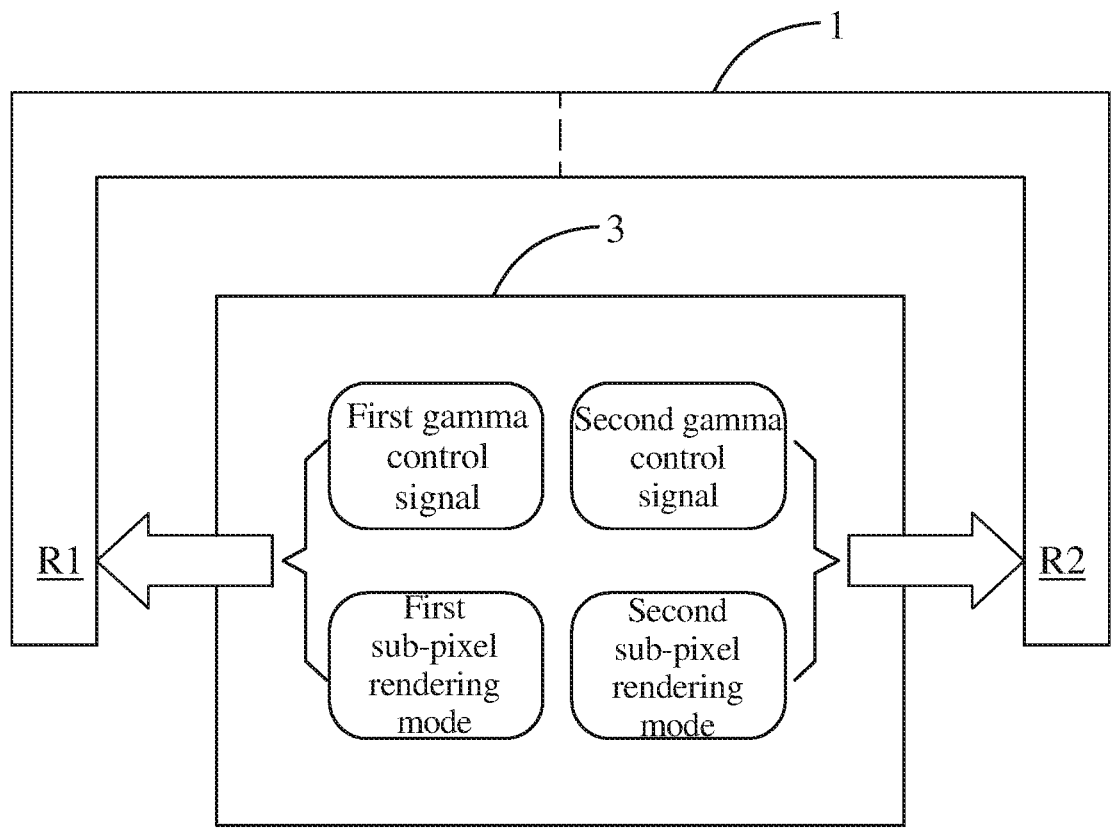
FIG. 6 is a schematic diagram of a control function of the first display region and the second display region, according to embodiments of the present disclosure.

Optionally, in an embodiment, as shown in FIGS. 5 and 6, the display part 1 is electrically connected to a controller 3 that generates a first gamma control signal and a second gamma control signal, wherein the first gamma control signal is configured to control the first sub-pixels within the first display region R1, the second gamma control signal is configured to control the second sub-pixels within the second display region R2, such that a brightness curve C2 of the second display region R2 is raised to a brightness curve C1 of the first display region R1.

When the display device of the above embodiment of the present disclosure is actually operated, it can operate in a display mode and a camera mode. When the display device is operated in the display mode, the second display region and the first display region both provide a display function, so as to display pictures harmoniously and achieve a screen ratio of nearly 100% on a mobile phone. When the display device is operated in the camera mode, the first display region provides the display function, and the second display region provides a photograph function, then the compatibility of the display mode and the camera mode of the display device is realized.

In another aspect, the display device of the embodiments of the present disclosure can further be integrated into an electronic apparatus, in order to provide a display function of the electronic apparatus. Providing an example for illustration, the electronic apparatus can be configured as an apparatus with specific purposes, such as a smartphone, a tablet, a notebook computer, or a desktop screen, such that the electronic apparatus can also provide many beneficial effects of the above-mentioned embodiments of the display device.

The display device and the electronic apparatus of the above-mentioned embodiments of the present disclosure are provided, in which, the pixel density of the second display region is less than the pixel density of the first display region, the first sub-pixels within the first display region are configured into the red-green-blue-green array, and the second sub-pixels within the second display region are configured into the red-green-blue array. In addition, the camera part is combined at the position corresponding to the second display region, such that the camera part can be used as an integrated solution for optical photographing, instead of separating multiple sensors with openings in the prior art. It can simplify the panel opening process and reduce the complexity of assembly of the whole device, and can also improve overall aesthetics.

The present disclosure has been described by related embodiments mentioned above, but the above-mentioned embodiments are only examples for implementing the present disclosure. It must be pointed out that, the disclosed embodiments do not limit the scope of the present disclosure. On the contrary, modifications and equivalent arrangements included in the spirit and scope of the claims are all included in the scope of the present disclosure.

What is claimed is:

1. A display device, comprising:
   a display part having a first display region and a second display region, wherein the first display region is around the second display region, a pixel density of the second display region is less than a pixel density of the first display region, a plurality of first sub-pixels within the first display region are configured into a red-green-blue-green array, a plurality of second sub-pixels within the second display region are configured into a red-green-blue array, a thickness of each of the second sub-pixels within the second display region is greater than a thickness of each of the first sub-pixels within the first display region, and a gap between the second sub-pixels of two adjacent rows or two adjacent columns within the second display region is larger than a gap between the first sub-pixels of two adjacent rows or two adjacent columns within the first display region; and
   a camera part disposed at a position corresponding to the second display region on a side of the display part, wherein the camera part has an image-acquiring-end portion toward the display part;
   wherein the display part comprises a substrate, an array layer, a pixel layer, a thin-film encapsulation layer, and a cover, which are sequentially stacked, and the substrate is provided with a concave-hole portion having a convex curved surface combined with the image-acquiring-end portion having a concave curved surface.

2. The display device as claimed in claim 1, wherein a light-emitting area of each of the second sub-pixels within the second display region is greater than a light-emitting area of each of the first sub-pixels within the first display region.

3. The display device as claimed in claim 1, wherein the substrate comprises a first polyimide layer, a silicon oxide layer, and a second polyimide layer, wherein the silicon oxide layer is located between the first polyimide layer and the second polyimide layer, the second polyimide layer is combined with the array layer, a part of the concave-hole portion is formed into a closed-hole portion on the second polyimide layer, and the closed-hole portion is attached to the image-acquiring-end portion.

4. The display device as claimed in claim 1, wherein the display part is electrically connected to a controller that generates a first gamma control signal and a second gamma control signal, wherein the first gamma control signal is configured to control the first sub-pixels within the first display region, the second gamma control signal is configured to control the second sub-pixels within the second display region, so that a brightness curve of the second display region is raised to a brightness curve of the first display region.

5. The display device as claimed in claim 1, wherein the second display region is shaped as a rectangular region or a hexagonal region.

6. A display device, comprising:
   a display part having a first display region and a second display region, wherein the first display region is around the second display region, a pixel density of the second display region is less than a pixel density of the first display region, a plurality of first sub-pixels within the first display region are configured into a red-green-blue-green array, and a plurality of second sub-pixels within the second display region are configured into a red-green-blue array; and
   a camera part disposed at a position corresponding to the second display region on a side of the display part, wherein the camera part has an image-acquiring-end portion toward the display part;
   wherein the display part comprises a substrate, an array layer, a pixel layer, a thin-film encapsulation layer, and a cover, which are sequentially stacked, and the substrate is provided with a concave-hole portion having a convex curved surface combined with the image-acquiring-end portion having a concave curved surface.

7. The display device as claimed in claim 6, wherein a light-emitting area of each of the second sub-pixels within the second display region is greater than a light-emitting area of each of the first sub-pixels within the first display region.

8. The display device as claimed in claim 6, wherein a thickness of each of the second sub-pixels within the second display region is greater than a thickness of each of the first sub-pixels within the first display region.

9. The display device as claimed in claim 6, wherein a gap between the second sub-pixels of two adjacent rows or two adjacent columns within the second display region is larger than a gap between the first sub-pixels of two adjacent rows or two adjacent columns within the first display region.

10. The display device as claimed in claim 6, wherein the substrate comprises a first polyimide layer, a silicon oxide layer, and a second polyimide layer, wherein the silicon oxide layer is located between the first polyimide layer and the second polyimide layer, the second polyimide layer is combined with the array layer, a part of the concave-hole portion is formed into a closed-hole portion on the second polyimide layer, and the closed-hole portion is attached to the image-acquiring-end portion.

11. The display device as claimed in claim 6, wherein the display part is electrically connected to a controller that generates a first gamma control signal and a second gamma control signal, wherein the first gamma control signal is configured to control the first sub-pixels within the first display region, the second gamma control signal is configured to control the second sub-pixels within the second display region, so that a brightness curve of the second display region is raised to a brightness curve of the first display region.

12. The display device as claimed in claim 6, wherein the second display region is shaped as a rectangular region or a hexagonal region.

13. An electronic apparatus comprising the display device as claimed in claim 6.

* * * * *